United States Patent [19]

Hasegawa

[11] Patent Number: 5,643,811
[45] Date of Patent: Jul. 1, 1997

[54] METHOD OF MAKING FIELD EFFECT TRANSISTOR FOR HIGH-FREQUENCY OPERATION

[75] Inventor: Yuuichi Hasegawa, Kawasaki, Japan

[73] Assignee: Fujitsu Limited, Kawasaki, Japan

[21] Appl. No.: 492,544

[22] Filed: Jun. 20, 1995

Related U.S. Application Data

[62] Division of Ser. No. 173,050, Dec. 27, 1993, abandoned.

[30] Foreign Application Priority Data

Jan. 7, 1993 [JP] Japan .......................................... 5-942

[51] Int. Cl.$^6$ ..................... H01L 21/283; H01L 21/338
[52] U.S. Cl. ..................... 437/40; 437/176; 437/912; 437/203
[58] Field of Search ..................... 437/40 SM, 40 LC, 437/40 GS, 41 SH, 41 LC, 41 GS, 203, 133, 126, 175, 176, 177, 912; 148/DIG. 72, DIG. 56, DIG. 65, DIG. 160

[56] References Cited

U.S. PATENT DOCUMENTS

| | | |
|---|---|---|
| 4,040,168 | 8/1977 | Huang . |
| 4,209,796 | 6/1980 | Senturia . |
| 4,849,368 | 7/1989 | Yamashita et al. ..................... 437/203 |
| 5,182,218 | 1/1993 | Fujihira ..................... 437/912 |

FOREIGN PATENT DOCUMENTS

| | | |
|---|---|---|
| 0 449 351 | 10/1991 | European Pat. Off. . |
| 2 239 017 | 2/1975 | France . |
| 57-23271 | 2/1982 | Japan . |
| 60-9171 | 1/1985 | Japan . |
| 51-248569 | 11/1986 | Japan . |
| 63-173374 | 7/1988 | Japan . |

OTHER PUBLICATIONS

F.F. Fang et al., IBM Tech. Discl. Bulletin, 16 (5) (1973) 1653, "Bidirectional HV MOSFET's" Oct. 1973.
Patent Abstracts of Japan, vol. 9, No. 118 (E-316) May 23, 1985 & JP-A-60 009 170 (Fujitsu KK) Jan. 18, 1985.
Patent Abstract of Japan, vol. 11, No. 292, (E-543), Sep. 19, 1987 & JP-A-62 092 478 (Matsushita Electric Ind Co Ltd) Apr. 27, 1987.
Patent Abstracts of Japan, vol. 11, No. 292 (E-543), Sep. 19, 1987 & JP-A-62 092 479 (Matsushita Electric Ind Co Ltd) Apr. 27, 1987.
Patent Abstracts of Japan, vol. 17, No. 81 (E-1321), Feb. 18, 1993 and JP-A-04 279 033 (Sharp Corp.) Oct. 5, 1992.
IBM Technical Disclosure Bulletin, vol. 28, No. 6, Nov. 1985, New York US, pp. 2684–2686, "Field-Effect Transistor".
Journal of Vacuum Science and Technology, Part B, Nov./Dec. 1991, vol. 9, No. 6, New York US, pp. 2856–2860, M.J. Rooks et al., "Split-gate Electron Waveguide Fabrication Using Multilayer Poly(methylmethacrylate)".
Patent Abstracts of Japan, vol. 16, No. 385 (E-1249), Aug. 17, 1992 & JP-A-04 125 938 (Fujitsu Ltd) Apr. 27, 1992.
N. Kato et al., *IEEE Electron Device Letters*, vol. 1 EDL-4, No. 11, Nov. 1983, "Influence of nt-Layer-Gate Gap on Short-Channel Effects of GaAs Self-Aligned MESFET's (Saint)", pp. 417–419.

*Primary Examiner*—Charles L. Bowers, Jr.
*Assistant Examiner*—Leon Radomsky
*Attorney, Agent, or Firm*—Staas & Halsey

[57] ABSTRACT

A field effect transistor including a gate electrode divided into a plurality of parts in the gate-length direction. The gate electrode makes Schottky-contacts with a semiconductor layer or is formed on the semiconductor layer through a gate insulating film.

9 Claims, 8 Drawing Sheets

METHOD OF MAKING FIELD EFFECT TRANSISTOR FOR HIGH-FREQUENCY OPERATION

CROSS-REFERENCE TO DIVISIONAL APPLICATION

The present application is a divisional application of to U.S. application Ser. No. 08/173,050, filed Dec. 27, 1993, in which one of the assignees is the same as the assignee of the present application, now abandoned.

BACKGROUND OF THE INVENTION

1. Field of the Invention

The present invention relates to a field effect transistor, particularly to a field effect transistor such as MESFET, HEMT, MISFET or MOSFET.

2. Description of the Related Art

Because a field effect semiconductor device made of compound semiconductor has a high carrier mobility, it is able to operate at a high frequency and used in many fields including supercomputers and microwave communication. It is particularly requested for a field effect transistor used for microwave communication to improve the output, efficiency, and high-frequency operation performance.

A MESFET (metal semiconductor field effect transistor) and HEMT (high electron mobility transistor) are listed as typical field effect transistors having a Schottky electrode among field effect transistors made of compound semiconductor.

Figure 1:
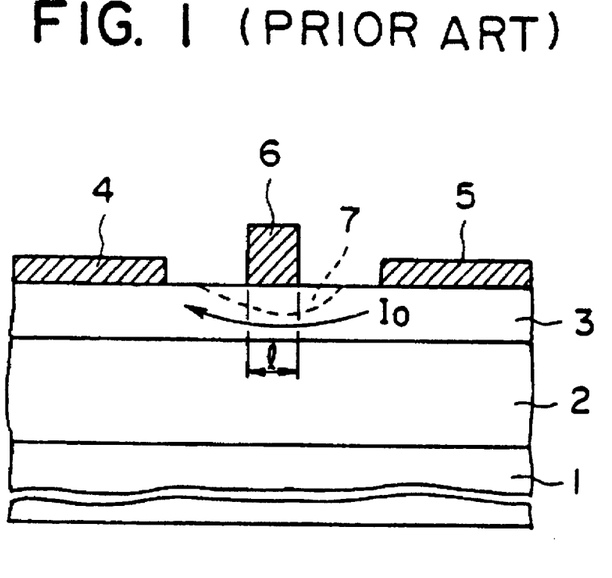
FIG. 1 is a sectional view of a long-gate MESFET according to the prior art.

FIG. 1 is a sectional view of general MESFET for explaining the prior art.

An i-GaAs buffer layer 2 and a n-GaAs active layer 3 are formed in order on a semi-insulating GaAs substrate 1, on which a source electrode 4, gate electrode 6, and drain electrode 5 are formed separately. The active layer 3 and gate electrode 6 Schottky-contact each other and a depletion layer 7 is formed in the active layer 3 at the joint between the active layer 3 and gate electrode 6. The source electrode 4 and drain electrode 5 ohmic-respectively contact the active layer 3 and a voltage is applied between a source and a drain.

It is well known that in a MESFET the voltage applied to the gate electrode 6 changes the spread of the depletion layer 7 and controls the drain-source current.

The quality of the high-frequency performance is estimated with a value of frequency f which is shown by the following expression.

$$f_1 = g_m / 2\pi C_{gs}$$

In the above expression, $g_m$ represents conductance and $C_{gs}$ represents input capacitance.

As the high-frequency operation performance of a MESFET is better, the cut-off frequency $f_1$ is higher. To make $f_1$ higher, it is necessary to decrease the input capacitance $C_{gs}$ and increase the mutual conductance $g_m$.

Therefore, to improve the high-frequency operation performance of a MESFET, it is effective to decrease the gate length and $C_{gs}$. However, it is described in the following document [1] that the mutual conductance $g_m$ is lower as the gate-length is shorter. The gate-length is a length of the gate electrode in the movement direction of carrier from a source region to a drain region. A direction from the source region to the drain region at the gate electrode is referred to as "gate-length direction".

[1] N. Kato et al., IEEE ELECTRON DEVICE LETTERS, Vol. EDL-4, No. 11, November 1983

Figure 2:
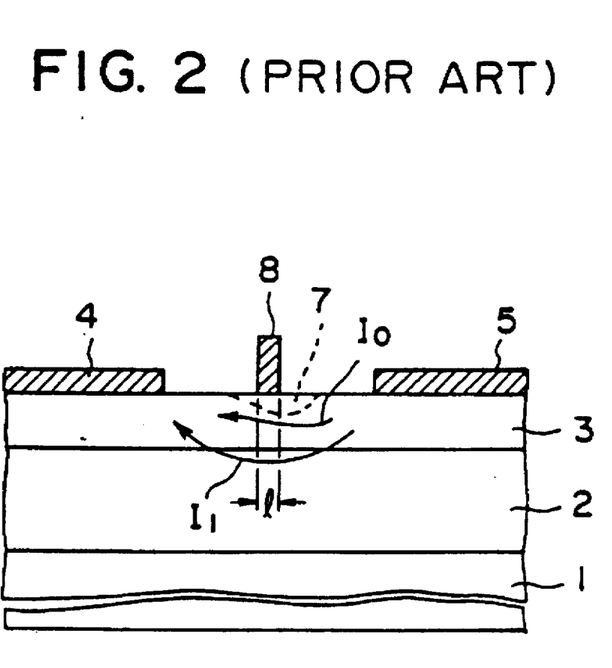
FIG. 2 is a sectional view of a short-gate MESFET according to the prior art.

FIG. 2 is a sectional view of a MESFET in which the gate length is short to decrease the input capacitance $C_{gs}$. In FIG. 2, a symbol same as that in FIG. 1 represents the same element. Generally a short gate length shown in FIG. 2 represents less than 0.5 μm and a long gate length shown in FIG. 1 represents 0.5 μm or more.

Figure 3:
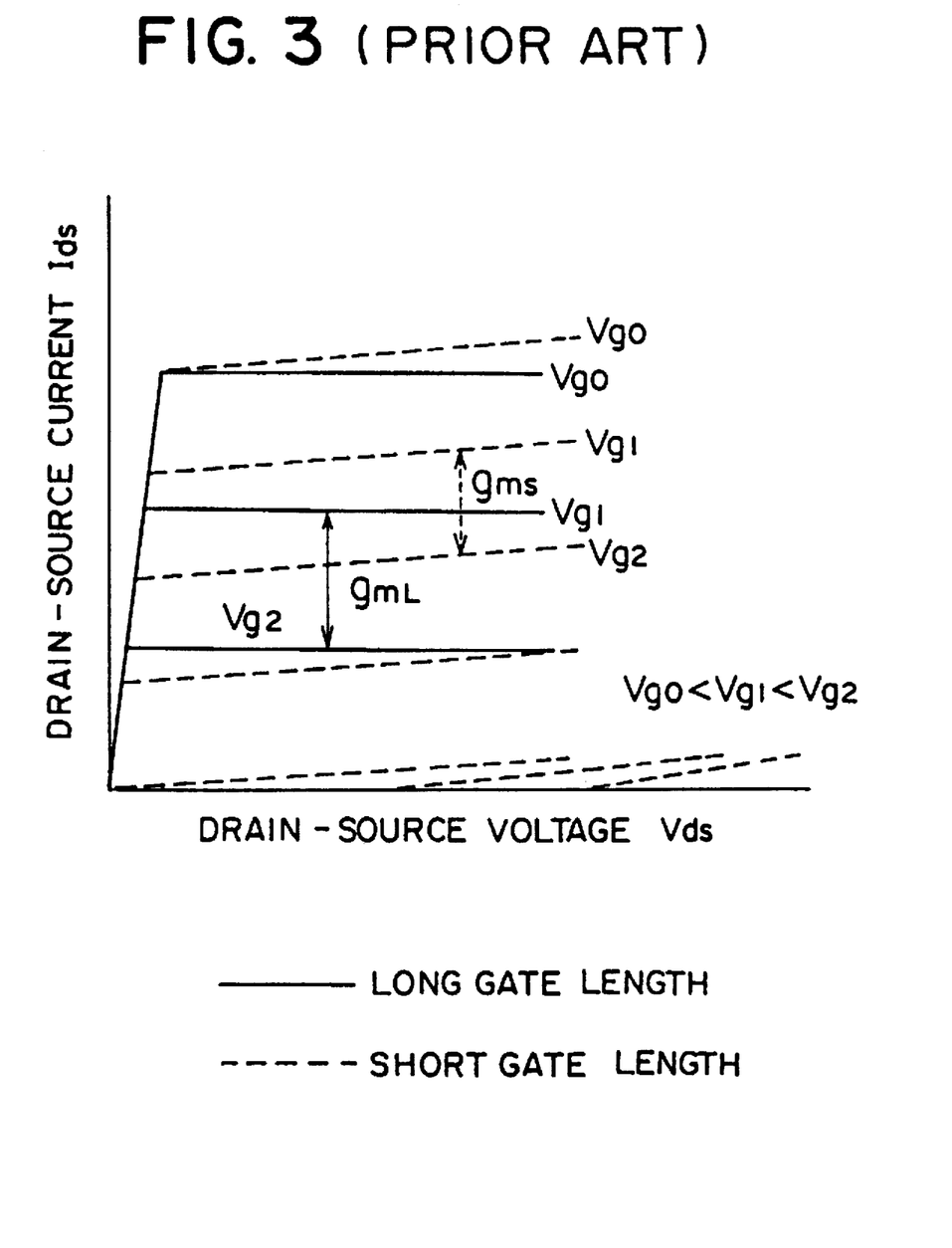
FIG. 3 is a characteristic diagram showing the relationship between drain-source voltage and drain-source current of long-gate and short-gate MESFETs.

The inventor of the present invention performed an experiment for comparing the characteristic of the long gate length of a MESFET with the characteristic of the short gate length of a MESFET. The results are shown in FIG. 3. In FIG. 3, the abscissa represents drain-source voltage $V_{ds}$ and the ordinate represents drain-source current $I_{ds}$.

In FIG. 3, a continuous line represents $V_{ds}$–$I_{ds}$ characteristic of a long-gate MESFET and a broken line represents the characteristic of a short-gate MESFET, and symbol $g_{mL}$ represents the mutual transfer conductance of the long-gate MESFET and symbol $g_{ms}$ represents the mutual transfer conductance of the short-gate MESFET. This characteristic diagram uses the gate voltage "Vg" as a parameter.

As the result of comparing the $V_{ds}$-$I_{ds}$ characteristic line of the short-gate MESFET with that of the long-gate MESFET, it is found that the inclination $(I_{ds}/V_{ds})$ of the characteristic line of the short-gate MESFET in the saturated region is larger than that of the long-gate MESFET. Saturation of a characteristic line is caused by the pinch-off phenomenon or carrier speed saturation phenomenon. Increase of drain-source current $I_{ds}$ in the saturated region represents that current $I_1$ flowing through the buffer layer 2 is large. The current $I_1$ flowing through the buffer layer 2 is referred to as "under current".

This is, as shown in FIG. 2, because the depletion layer 7 shortens in the gate-length direction as the gate electrode 8 is shortened and an electric field applied to the both sides of the depletion layer 7 becomes large. The under current $I_1$ cannot be controlled by a voltage applied to the gate electrode 8.

Therefore, when the under current $I_1$ increases, the effective mutual conductance $g_{ms}$ decreases and the cut-off frequency $f_1$ does not increase as expected. It is described in the above document [I] that a threshold voltage is lowered by extending the interval between the source and drain of the short-gate MESFET.

SUMMARY OF THE INVENTION

It is an object of the present invention to decrease the parasitic capacitance due to a gate electrode and provide a field effect transistor for increasing the mutual conductance.

The present invention provides a field effect transistor having a plurality of gate electrodes divided in the gate-length direction. The divided gate electrodes make Schottky-contacts with a semiconductor layer or are formed on the semiconductor layer through a gate insulating film.

The capacitance generated between the gate electrode and semiconductor layer is almost determined by the contact area between the gate electrode and semiconductor layer or the contact area between the gate electrode and gate insulating film. Moreover, depletion layers are produced from the contact surfaces of each of the divided gate electrodes and the semiconductor layer and a plurality of produced depletion layers are incorporated in the semiconductor layer by applying a voltage to the gate electrodes. Therefore, the effective gate length related to the spread of depletion layers and the transfer conductance are determined by the sum of the lengths of divided gate electrodes and those of regions for dividing the electrodes in the gate-length direction.

Therefore, when setting the sum of the lengths of only the divided gate electrodes in the gate-length direction to 0.5 μm or less, decrease of gate parasitic capacitance is achieved which is the feature of a short gate and a large transfer conductance and a wide depletion layer are obtained which is the feature of a long gate.

DESCRIPTION OF THE PREFERRED EMBODIMENTS

The structure of the field effect transistor of the first embodiment of the present invention is described below in accordance with the fabrication steps.

FIGS. 4A to 4F are sectional views of the steps of fabricating the METAL SEMICONDUCTOR field effect transistor or the MESFET of the first embodiment of the present invention.

Figure 4A:
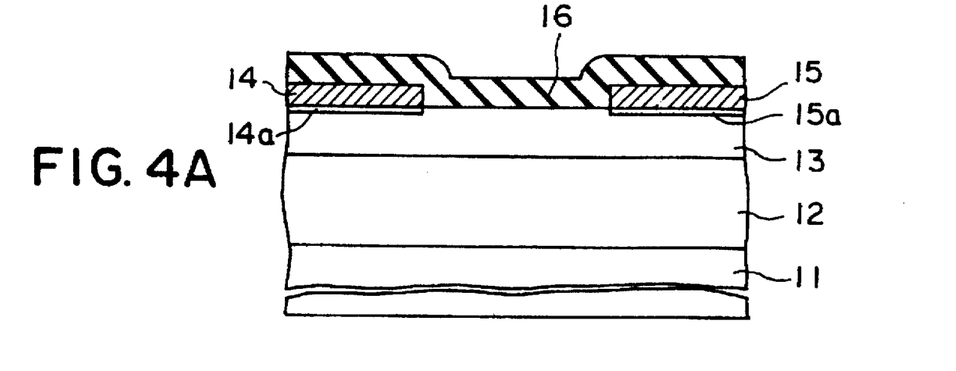
FIGS. 4A to 4F are sectional views showing the steps of fabricating the MESFET of the first embodiment of the present invention.

The following is the description of steps up to the state shown in FIG. 4A.

First, a buffer layer 12 made of i-GaAs and an active layer 13 made of n-GaAs are formed in order on a substrate 11 made of a semiconductor insulator GaAs up to the thicknesses of 500 and 150 nm respectively. The buffer layer 12 and active layer 13 are deposited by means of metal organic chemical vapor deposition (hereafter referred to as MOCVD).

Silicon (Si) is used as an impurity to make the active layer 13 n-type and the impurity concentration is $2 \times 10^{17}$ atoms/$cm^3$. Growth of semiconductor crystal constituting the buffer layer 12 and active layer 13 is not restricted to MOCVD. It is possible to properly use, for example, molecular beam epitaxy (hereafter referred to as MBE).

Thereafter, not-illustrated photoresist is applied, exposed, and developed to form a window of the photoresist in a source region and drain region on the surface of the active layer 13. Then, gold-germanium alloy (AuGe) and gold (Au) are deposited on the active layer 13 through the window and on the photoresist up to the thicknesses of 40 and 400 nm respectively by means of vacuum deposition. Moreover, a source electrode 14 and drain electrode 15 which are made of AuGe/Au are formed by means of lift-off which remains a metallic film in the window by removing the photoresist. There is a channel region in the active layer 13 between the source electrode 14 and the drain electrode 15.

Then, the substrate 11 is heated at the temperature of 450° C. for 2 min. to alloy AuGe for constituting the source electrode 14 and drain electrode 15 and GaAs for constituting the active layer 13 resulting in forming $n^+$-type contact layers 14a and 15a.

Thereafter, an insulating film 16 made of $SiO_2$ is formed up to the thickness of 300 nm by means of chemical vapor deposition (CVD). It is possible to use SiN, SiON, or other insulating material for the insulating film 16.

Figure 4B:
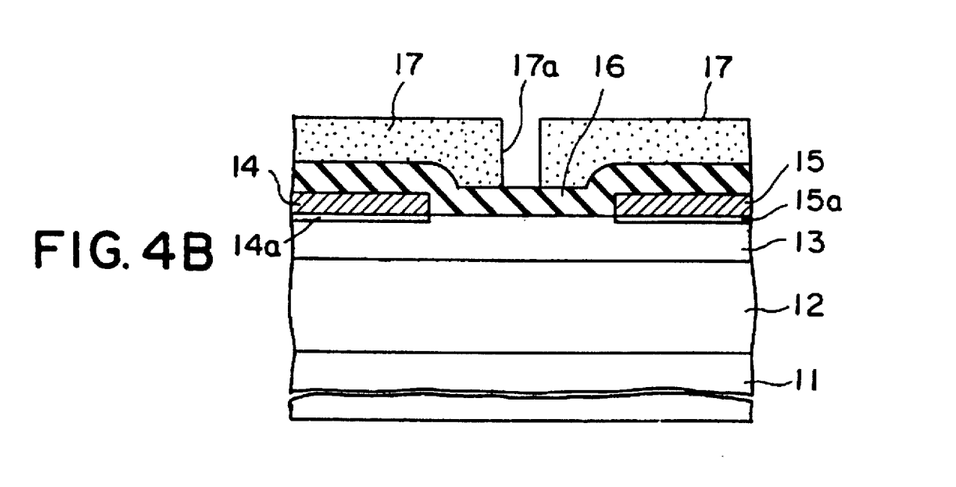
Figure 4C:
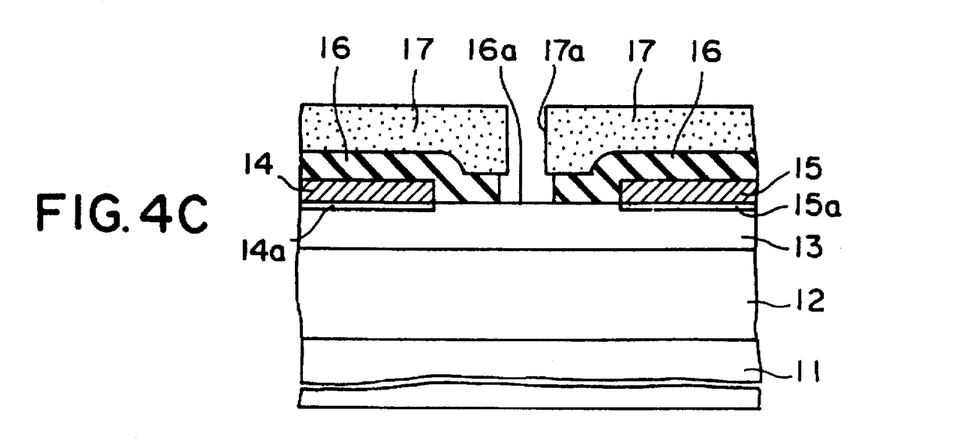

Then, photoresist 17 is applied onto the insulating film 16 and thereafter exposed and developed to form a window 17a inside a gate electrode region to be formed as shown in FIG. 4B. Moreover, the insulating film 16 is locally etched by using the photoresist 17 as a mask and buffer hydrofluoric acid as etchant to form an opening 16a on the insulating film 16 as shown in FIG. 4C. Thus, part of the active layer 13 is exposed through an opening 16a.

The film 16 is slightly side-etched, resulting in that the opening 16a of the film 16 is slightly wider than the window 17a of the photoresist 17, and the photoresist 17 is protruded at the top of the opening 16a like a hood.

The opening 16a is formed into a size equal to the gate electrode region, and the length of the opening 16a in the gate-length direction is set to, for example, 0.8 μm and the length of the window 17a of the photoresist 17 corresponding to the gate-length direction is set to, for example, 0.5 μm.

Then, an insulating film 18 made of, for example, aluminum nitride (AlN) is formed up to the thickness of 700 nm by means of electron cyclotron resonance (ECR) plasma CVD. The deposition method for the insulating film 18 used here is not restricted to ECR plasma CVD as long as the deposition has a large anisotropy. The insulating film 18 is made of a chemically-stable material. It is preferable for the material to have lower permeability in order to decrease the parasitic capacitance. It is possible to use $SiO_2$ or $Al_2O_3$ as the material. In this case, it is necessary to decrease the difference of thermal expansion between the material and a film formed on the material.

Figure 4D:
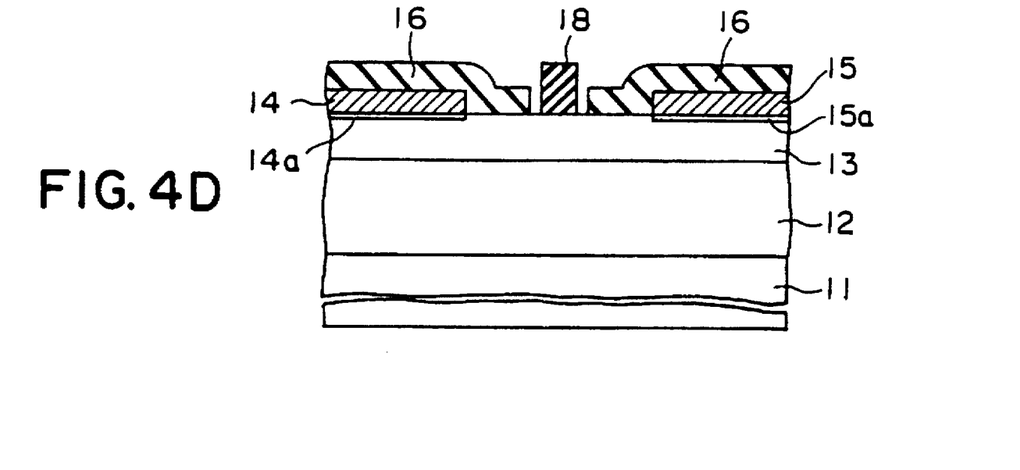

Thereafter, the insulating film 18 is patterned by means of lift-off performed by removing the photoresist 17 with a liquid such as acetone. After completing this step, the insulating film 18 separated from the inner wall of the opening 16a of the insulating film 16 is left at the central portion of the active layer 13 exposed from the opening 16a as shown in FIG. 4D. The length of the insulating film 18 in the gate-length direction is, for example, 0.5 μm and the distance up to the insulating film 16 at the both sides of the film 18 is 0.15 μm.

Figure 4E:
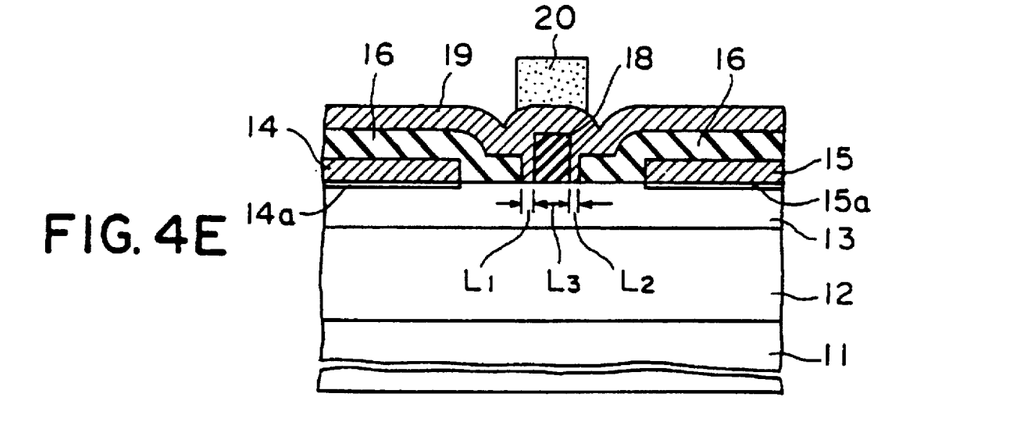

The following is the description of steps up to the state shown in FIG. 4E.

First, for example, a conducting film 19 made of aluminum (Al) is formed up to the thickness of 700 nm by means of sputtering or vacuum deposition. Aluminum is used for the conducting film 19 because the thermal expansion of aluminum is almost the same as that of AlN constituting the insulating film 18. The material of the conducting film 19 is not restricted to aluminum. Any material can be used as long as it makes Schottky-contacts with GaAs constituting the active layer 13.

Thereafter, photoresist is applied onto the conducting film 19, and then exposed and developed to form a resist pattern 20 to form the gate electrode region.

Figure 4F:
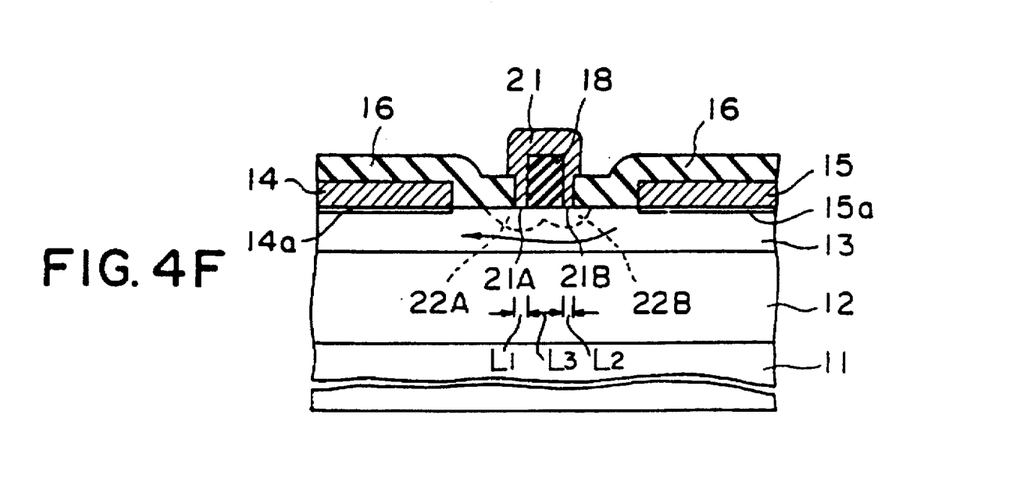

Then, the conducting film 19 is patterned using photoresist 20 as a mask by means of dry etching using a chlorine-based gas such as $CCl_4$. Thus, a gate electrode 21 shown in FIG. 4F is formed. The gate electrode is divided into two parts in a gate-length direction.

The gate electrode 21 between the source electrode 14 and drain electrode 15 makes Schottky-contacts with the active layer 13 in regions 21A and 21B at the both sides of the insulating film 18.

The MESFET fabricated in the above steps has the gate electrode 21 divided on the surface of the active layer 13 through the insulating film 18. When setting the lengths L1 and L2 of the gate electrode 21 in two divided regions 21A and 21B to, for example, 0.15 µm respectively, the sum of the length of the gate electrode 21 making Schottky-contacts with the active layer 13 comes to 0.3 µm and this value comes to the gate length related to an input capacitor.

As shown in FIGS. 4E and 4F, when a gate voltage is applied to the gate electrode 21, two depletion layers 22A and 22B produced in the active layer 13 due to Schottky junction spread in a range from both sides of the insulating film 18 to a periphery as shown in FIG. 4F.

Thereby, because a depletion layer is also produced in a region under the insulating film 18 dividing the gate electrode 21, a gate length related to an under current and transfer conductance substantially comes to the total sum of the lengths $L_1$ and $L_2$ of the divided gate electrodes 21 and the interval $L_3$ between the divided gate electrodes 21.

Therefore, when setting the lengths $L_1$ and $L_2$ of the divided gate electrodes 21 in two regions to 0.15 µm respectively and the interval between the divided gate electrodes to 0.5 µm, the gate length related to the under current and transfer conductance substantially comes to 0.8 µm. In this case, the length represents a length in the gate-length direction.

Figure 5:
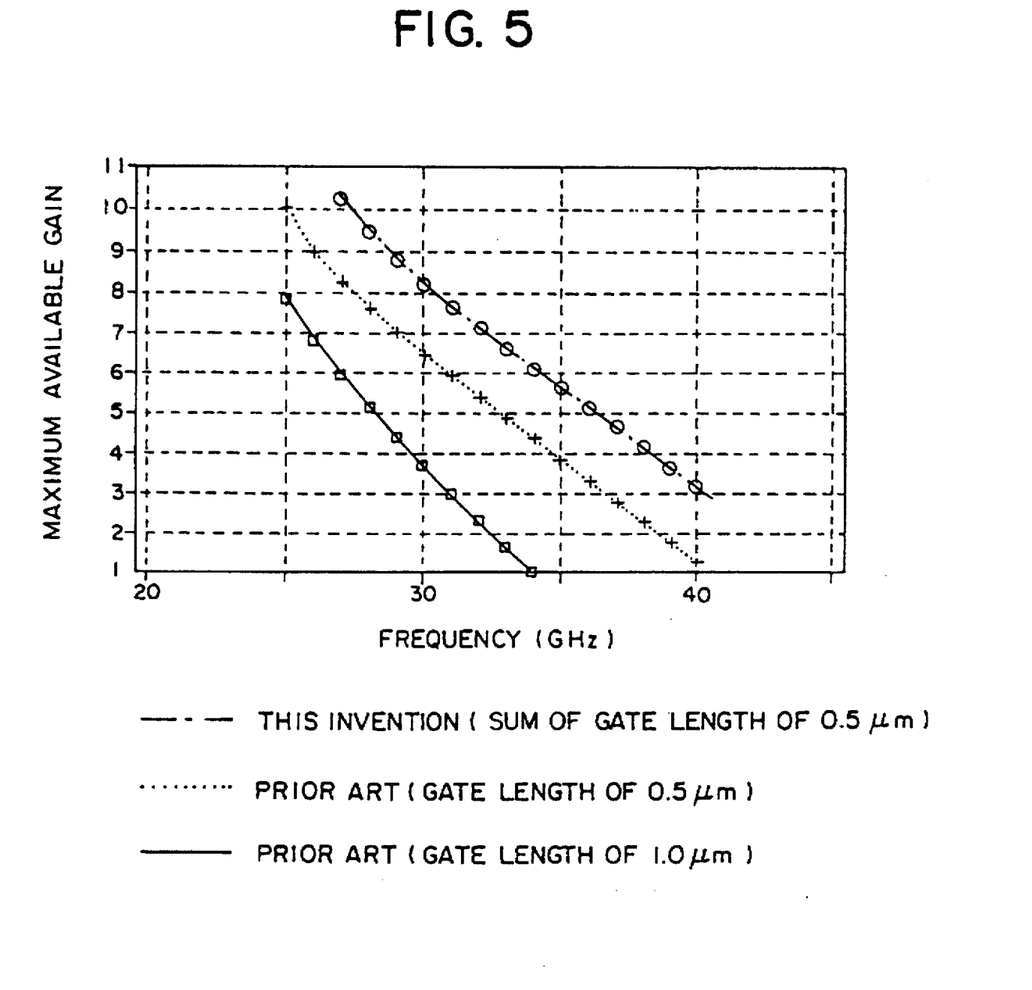
FIG. 5 is a characteristic diagram showing the relationship between frequency and maximum gain of a short-gate MESFET according to the prior art and the relationship between frequency and maximum gain of a long-gate MESFET according to the prior art, and the relationship between frequency and maximum gain of the MESFET of the first embodiment of the present invention.

FIG. 5 shows the relationship between frequency and maximum available gain of a MESFET for explaining the advantage of the present invention, which is a characteristic diagram obtained through experiments. The axis of abscissas of the diagram represents frequency and the axis of ordinates of it represents maximum available gain.

In FIG. 5, the alternate long and short dash line represents the characteristic of the MESFET of this embodiment in which the gate length of the gate electrode 21 excluding the insulating film 18 comes to 0.5 µm, the broken line represents the characteristic of MESFET of prior art with the gate length of 0.5 µm shown in FIG. 2, and the continuous line represents the characteristic of the MESFET of prior art with the gate length of 1.0 µm shown in FIG. 1. The gate widths of these three MESFETs are set to 180 µm respectively and the components of them excluding gate electrodes are the same.

From these characteristic lines, it is found that the MESFET of this embodiment of the present invention has a higher gain in a higher frequency range than the prior art MESFETs and the device of this embodiment is superior to the prior art devices in the frequency range of at least 25 to 40 GHz.

Figure 6:
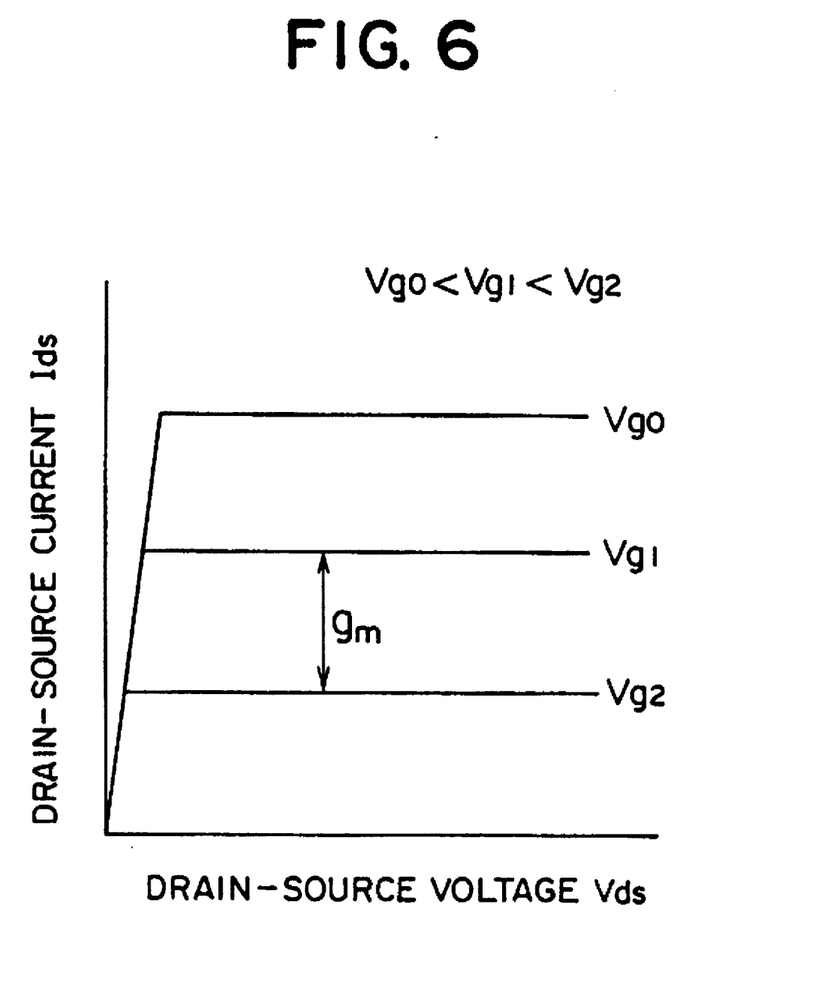
FIG. 6 is a characteristic diagram showing the relationship between drain-source voltage and drain-source current of the MESFET of the first embodiment of the present invention.

The relationship between source-drain voltage and source-drain current of the MESFET of this embodiment is shown in FIG. 6. It appears a large transfer conductance $g_m$ which is the feature of a long gate electrode and the decrease of the inclination of the characteristic line in the saturated region.

Thus, it is found that the under current flowing through the buffer layer 12 decreases.

As described above, when setting the total length of only the gate electrode 21 in the gate-length direction to 0.5 µm or less on the surface of the active layer 13, a decrease of the parasitic capacitance is achieved which is the feature of a short gate and a large transfer conductance and wide depletion layer are obtained which is the feature of a long gate.

For the above embodiment, a gate electrode divided in the gate-length direction on the surface of a semiconductor layer is applied to a MESFET. However, it is also possible to apply the gate electrode to a HEMT, MISFET and MOSFET.

Figure 7:
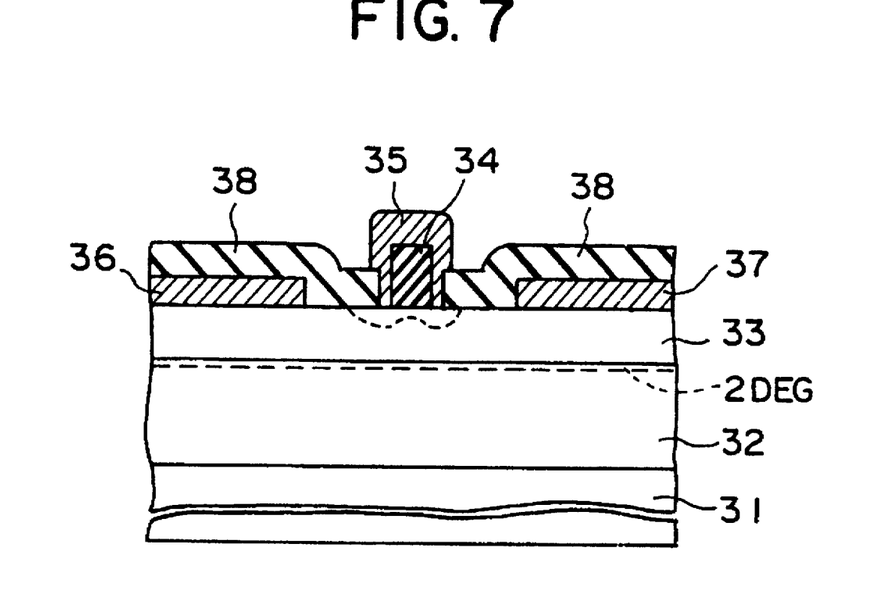
FIG. 7 is a sectional view of the HEMT of the second embodiment of the present invention.

FIG. 7 is a sectional view of an embodiment in which the above gate electrode is applied to HEMT.

A non-doped GaAs electron transit layer 32 and an n-Al GaAs electron supply layer 33 are formed in order on a semi insulating GaAs substrate 31. Moreover, a gate electrode 35 divided in the gate-length direction is formed at the both sides of an insulating film 34 on the surface of the electron supply layer 33, and a source electrode 36 and drain electrode 37 are further formed at the both sides of the insulating film 34. The gate electrode 35 makes Schottky-contacts with the electron supply layer 33 and the source electrode 36 and drain electrode 37 respectively ohmic-contact the electron supply layer 33. Two-dimensional electron gas 2DEG is produced in an interface region between the electron supply layer 33 and electron transit layer 32. There is a channel region in the interface region between the source electrode 36 and the drain electrode 37. Symbol 38 represents an insulating film for covering the electron supply layer 33, source electrode 36, and drain electrode 37.

Also for this embodiment, the junction capacitance of the gate electrode 35 is determined by the contact area between the gate electrode 35 and electron supply layer 33. An effective gate length related to the spread of a depletion layer and a transfer conductance is determined by the lengths of the gate electrode 35 and insulating film 34 in the gate-length direction.

Figure 8:
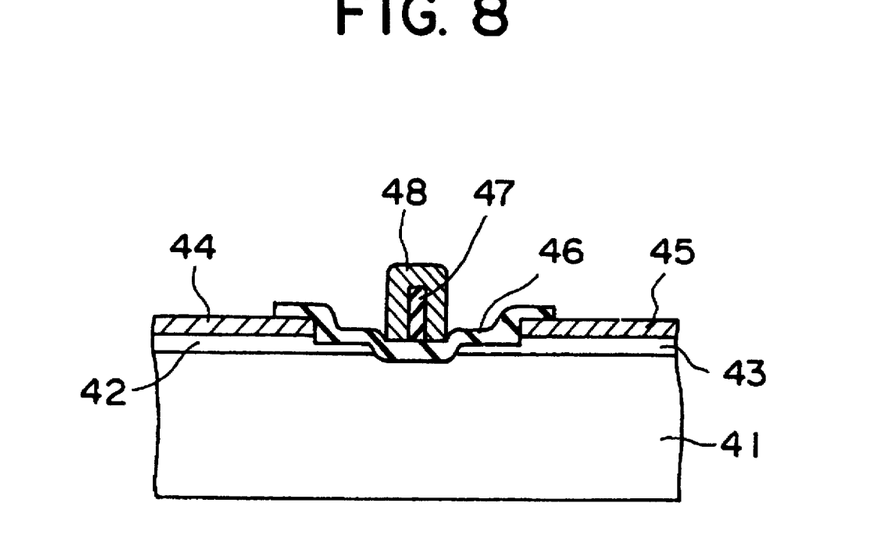
FIG. 8 is a sectional view of the MISFET of the third embodiment of the present invention.

FIG. 8 is a sectional view of an embodiment in which the above gate electrode is applied to a MISFET.

Two contact layers 42 and 43 containing silicon are formed in a source region and drain region on a semi-insulating InP substrate 41 respectively and a source electrode 44 and drain electrode 45 made of AuGe are formed on the contact layers 42 and 43. Moreover, a gate insulating film 46 made of $Al_2O_3$ is formed on the InP substrate 41 in a region between the source electrode 44 and drain electrode 45 and a gate electrode 48 divided in the gate-length direction at the both sides of the insulating film 47 is formed on the gate insulating film 46. The divided gate electrodes 48 are incorporated on the insulating film 47.

Also for this embodiment, a capacitance generated between the gate electrode 48 and InP substrate 41 is almost determined by the contact area between the gate electrode 48 and gate insulating film 46 and an effective gate length related to the spread of a depletion layer produced in the InP substrate 41 and a transfer conductance is determined by the sum of the lengths of the divided gate electrodes 47 and the insulating film 48 in the gate-length direction.

Figure 9:
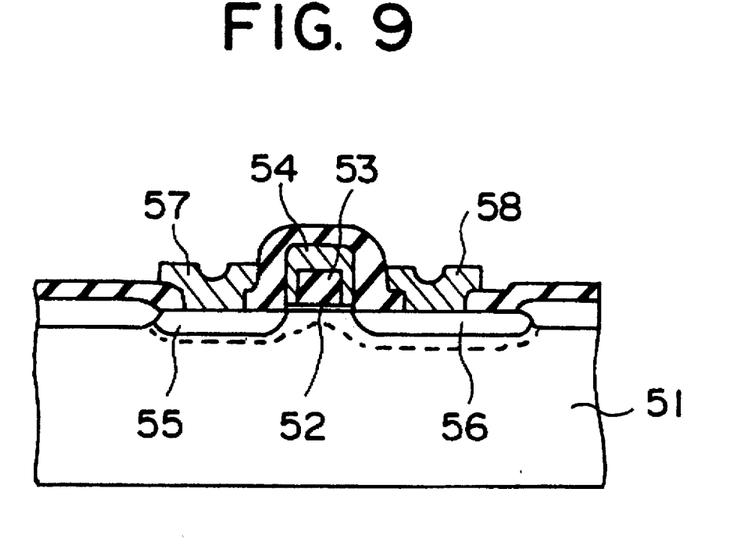
FIG. 9 is a sectional view of the MOSFET of the fourth embodiment of the present invention.

FIG. 9 is a sectional view of an embodiment in which the above gate electrode is applied to a MOSFET.

In FIG. 9, a gate insulating film 52 is formed on a semiconductor layer 51 made of silicon and a gate electrode 54 divided in the gate-length direction is formed on the surface of the gate insulating film 52 through an insulating film 53. A source region 55 and drain region 56 are formed on the semiconductor layer 51 at both sides of the gate electrode 54. A source electrode 57 is connected to the source region 55 and a drain electrode 58 is connected to the drain region 56.

Also for this embodiment, a capacitance generated by the gate electrode 54 and semiconductor layer 51 is almost determined by the contact area between the gate electrode 54 and gate insulating film 52 and an effective gate length related to the spread of a depletion layer formed in a channel region of the semiconductor layer and a transfer conductance is determined by the total sum of the lengths of the divided gate electrodes 54 and the insulating film 53 in the gate-length direction.

Figure 10:
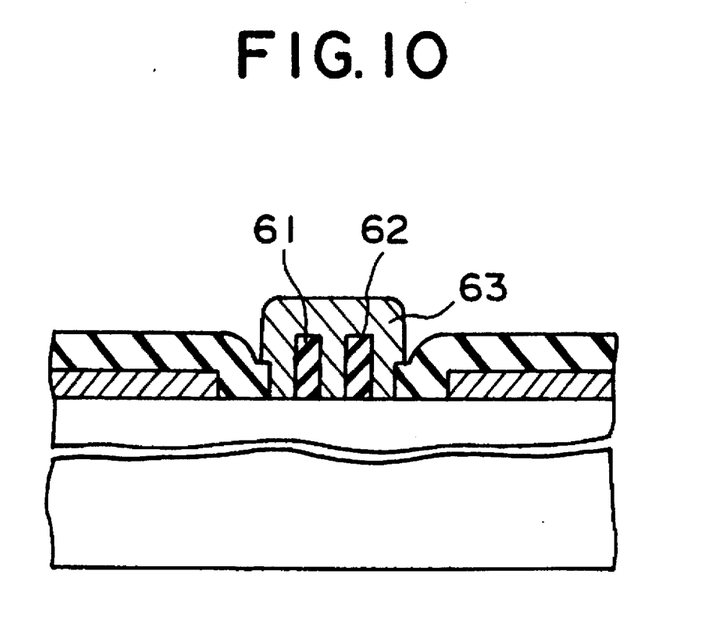
FIG. 10 is a sectional view of the gate electrode of the FET of the fifth embodiment of the present invention.

Each of the above embodiments uses a gate electrode divided into two parts in the gate-length direction. However, as shown in FIG. 10, it is also possible to use a gate electrode 63 divided into three parts in the gate-length direction through two insulating films 61 and 62 on one surface or the gate electrode 63 divided into a plurality of parts in the gate-length direction through a plurality of insulating films. Divided gate electrodes are incorporated on insulating films are connected through other conducting films to be the same potential.

By adding a division of the gate electrode in the direction of channel width (gate-width), it is possible the gate parasitic capacitance to decrease further.

What is claimed is:

1. A method for fabricating a field effect transistor, comprising the steps of:

forming a source electrode and a drain electrode on a surface of a semiconductor layer;

forming an insulating film on the surface of said semiconductor layer in a region between said source and drain electrode, the surface under which a channel region is formed, forming a mask layer on said insulating film, said mask layer having a window which is formed above said channel region;

forming an opening in said insulating film by removing a part of said insulating film exposed through said window;

enlarging said opening in said insulating film by conducting a side etching in said opening;

forming a dividing layer of an insulator in said enlarged opening and on said surface of the semiconductor layer, thus dividing said opening into at least two parts;

removing said mask layer;

depositing a gate electrode material on the insulating film so as to fill said at least two parts of the opening and to cover said dividing layer; and patterning said gate electrode material on the insulating film to form a gate electrode in the enlarged opening to cover the dividing layer.

2. The method for fabricating the field effect transistor according to claim 1, wherein the gate electrode divided into the plurality of parts make Schottky-contacts with the semiconductor layer.

3. The method for fabricating the field effect transistor according to claim 2, wherein the sum of the lengths of the parts of the gate electrode in the direction from the source region to the drain region is 0.5 µm or less.

4. The method for fabricating the field effect transistor according to claim 1, wherein the gate electrode divided into the plurality of parts is formed on the semiconductor layer through a gate insulating film.

5. The method for fabricating the field effect transistor according to claim 4, wherein the sum of the lengths of the parts of the gate electrode in the direction from the source region to the drain region is 0.5 µm or less.

6. The method for fabricating the field effect transistor according to claim 1, wherein the field effect transistor comprises:

a source electrode and a drain electrode which are separately formed on an active semiconductor layer and make ohmic-contacts with the active semiconductor layer, the active layer containing impurities; and a gate electrode which makes Schottky-contacts with the active semiconductor layer in a region between the source and drain electrodes and is divided into a plurality of parts in a direction from the source electrode to the drain electrode on the active semiconductor layer.

7. The method for fabricating the field effect transistor according to claim 6, wherein the active semiconductor layer is made of compound semiconductor.

8. The method for fabricating the field effect transistor according to claim 1, wherein the field effect transistor comprises:

an impurity-contained semiconductor layer and a non-doped semiconductor layer for generating two-dimensional electrons at interface of the impurity-contained semiconductor layer and the non-doped semiconductor layer;

a source electrode and a drain electrode which are separately formed and make ohmic-contact with the impurity-contained semiconductor layer; and a gate electrode which is divided into a plurality of parts in a direction from the source electrode to the drain electrode and makes Schottky-contacts with the surface of the impurity-contained semiconductor layer.

9. The method for fabricating the field effect transistor according to claim 8, wherein the impurity-contained semiconductor layer is made of first compound semiconductor and the non-doped semiconductor layer is made of second compound semiconductor.

* * * * *

UNITED STATES PATENT AND TRADEMARK OFFICE
CERTIFICATE OF CORRECTION

PATENT NO. : 5,643,811
DATED : July 1, 1997
INVENTOR(S) : Yuuichi HASEGAWA

It is certified that error appears in the above-indentified patent and that said Letters Patent is hereby corrected as shown below:

Title Page, Item [56] - References Cited - Foreign Patent Documents, line 5, change "51-248569" to --61-248569--.

Signed and Sealed this

Twenty-third Day of September, 1997

Attest:

BRUCE LEHMAN

*Attesting Officer*  *Commissioner of Patents and Trademarks*